US008809962B2

(12) United States Patent
Liu et al.

(10) Patent No.: US 8,809,962 B2
(45) Date of Patent: Aug. 19, 2014

(54) TRANSISTOR WITH REDUCED PARASITIC CAPACITANCE

(75) Inventors: Yanxiang Liu, Wappingers Falls, NY (US); Jinping Liu, Hopewell Junction, NY (US); Min Dai, Mahwah, NJ (US); Xiaodong Yang, Hopewell Junction, NY (US)

(73) Assignees: GlobalFoundries Inc., Grand Cayman (KY); GlobalFoundries Singapore Pte. Ltd., Singapore (SG); International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/218,988

(22) Filed: Aug. 26, 2011

(65) Prior Publication Data
US 2013/0049142 A1 Feb. 28, 2013

(51) Int. Cl.
| | |
|---|---|
| H01L 29/78 | (2006.01) |
| H01L 21/336 | (2006.01) |
| H01L 29/66 | (2006.01) |
| H01L 29/49 | (2006.01) |
| H01L 29/51 | (2006.01) |

(52) U.S. Cl.
CPC ...... H01L 29/6653 (2013.01); H01L 29/66545 (2013.01); *H01L 29/4966* (2013.01); *H01L 29/513* (2013.01); *H01L 29/517* (2013.01); *H01L 29/66628* (2013.01); *H01L 29/66553* (2013.01); H01L 29/4983 (2013.01)
USPC ............ 257/386; 257/412; 257/388; 438/591

(58) Field of Classification Search
USPC .................................................. 257/386–389
See application file for complete search history.

(56) References Cited

U.S. PATENT DOCUMENTS

| | | | | |
|---|---|---|---|---|
| 6,372,584 | B1 * | 4/2002 | Yu ................................. | 438/300 |
| 6,512,266 | B1 * | 1/2003 | Deshpande et al. .......... | 257/333 |
| 6,861,704 | B2 * | 3/2005 | Asada et al. .................. | 257/336 |
| 6,995,434 | B2 * | 2/2006 | Usui et al. .................... | 257/368 |
| 2006/0251801 | A1 * | 11/2006 | Weidman et al. ............ | 427/99.5 |
| 2007/0194387 | A1 * | 8/2007 | Dyer et al. .................... | 257/369 |
| 2009/0001480 | A1 * | 1/2009 | Cheng ........................... | 257/387 |
| 2011/0241115 | A1 * | 10/2011 | Lavoie et al. ................. | 257/347 |
| 2012/0235244 | A1 * | 9/2012 | Yin et al. ....................... | 257/368 |

* cited by examiner

*Primary Examiner* — Marc Armand
*Assistant Examiner* — Quinton Brasfield
(74) *Attorney, Agent, or Firm* — Ditthavong & Steiner, P.C.

(57) ABSTRACT

Scaled transistors with reduced parasitic capacitance are formed by replacing a high-k dielectric sidewall spacer with a $SiO_2$ or low-k dielectric sidewall spacer. Embodiments include transistors comprising a trench silicide layer spaced apart from a replacement metal gate electrode, and a layer of $SiO_2$ or low-k material on a side surface of the replacement metal gate electrode facing the trench silicide layer. Implementing methodologies may include forming an intermediate structure comprising a removable gate with nitride spacers, removing the removable gate, forming a layer of high-k material on the nitride spacers, forming a layer of metal nitride on the high-k material, filling the opening with insulating material and then removing a portion thereof to form a recess, removing the metal nitride layers and layers of high-k material, depositing a layer of $SiO_2$ or low-k material, and forming a replacement metal gate in the remaining recess.

20 Claims, 10 Drawing Sheets

TRANSISTOR WITH REDUCED PARASITIC CAPACITANCE

TECHNICAL FIELD

The present disclosure relates to scaled devices, e.g., MOSFETs, exhibiting reduced parasitic capacitance and increased performance. The present disclosure is particularly applicable to fabricating semiconductor devices including a trench silicide layer spaced apart from a replacement metal gate electrode.

BACKGROUND

As technological advances plunge deeper into submicron geometries, it becomes increasingly more difficult to satisfy the demands for high performance. A major impediment to high performance of scaled devices, such as MOSFETs, is parasitic capacitance. For example, in conventional devices employing a replacement metal gate electrode for improved drive current, a high parasitic capacitance is generated by virtue of a trench silicide between replacement metal gates. Typically, a high-k layer, such as a layer having a dielectric constant of at least 15, with 1 being the dielectric constant of a vacuum, is formed on the side surfaces of the replacement metal gate and on a silicon nitride spacer, having a dielectric constant of 7. Such devices are particularly hindered by the formation of a high parasitic capacitance.

Efforts to address the parasitic capacitance problem have included the formation of a thick spacer to reduce the inter-gate spacing. However, this technique disadvantageously degrades epitaxial SiGe, makes it more difficult to fill the spaces between the gates, and increases the distance between the epitaxial SiGe and MOSFET channel. Another approach involved reducing the gate height; however, gate resistance is disadvantageously increased and gate height variability degraded. Another attempt involved lowering the raised source/drain region; however, external resistance and junction leakage were disadvantageously increased.

A need therefore exists for semiconductor devices having reduced parasitic capacitance, and enabling methodology. A particular need exists for semiconductor devices including a metal gate electrode spaced apart from a trench silicide having reduced parasitic capacitance, and enabling methodology.

SUMMARY

An aspect of the present disclosure is a semiconductor device exhibiting reduced parasitic capacitance.

Another aspect of the present disclosure is a method of fabricating a semiconductor device exhibiting reduced parasitic capacitance.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a device including: a substrate; a replacement metal gate electrode spaced on the substrate; and a layer of silicon dioxide ($SiO_2$) or low-k material on a side surface of the replacement metal gate electrode.

Aspects of the present disclosure include a device including devices with a layer of carbon or fluorine doped silicon oxide as the layer of low-k material. Further aspects include a device wherein the gate electrode comprises a metal, such as at least one of titanium aluminum, titanium, aluminum, and titanium nitride. Additional aspects include devices including a trench silicide layer, which may optionally be formed on a raised source/drain region, wherein the trench silicide is spaced apart from the replacement metal gate electrode at a distance of less than 15 nm, e.g., 4.8 to 15 nm, and wherein the layer of $SiO_2$ or low-k material has a thickness of less than 8 nm, e.g., 4.5 to 8 nm.

Another aspect of the present disclosure includes forming a metal gate structure over a substrate, the metal gate structure including a replacement metal gate, a layer of $SiO_2$ or low-k material on side surfaces of the replacement metal gate, and a nitride spacer on the layers of $SiO_2$ or low-k material; optionally forming a raised source/drain region over the substrate spaced apart from the replacement metal gate at a first distance; and optionally forming a trench silicide layer on the optional raised source/drain region, the trench silicide layer spaced apart from the replacement metal gate at a second distance greater than the first distance.

Further aspects of the present disclosure include forming an intermediate structure in an insulating layer, the intermediate layer including a removable gate having the nitride spacer on the side surfaces; removing the removable gate leaving an opening having a width defined by the nitride spacers in the insulating layer; forming a layer of high-k material on the nitride spacers lining the opening; e.g., a material having a dielectric constant k of 15 or greater; forming a layer of metal nitride on the layers of high-k material; filling the opening with an insulating material; removing a portion of the insulating material from the opening leaving a recess with a width defined by the metal nitride layers; removing the metal nitride layers from the recess, leaving the recess with a width defined by the layers of high-k material; removing the layers of high-k material from the recess, leaving the recess with a width defined by the nitride spacers; depositing a layer of $SiO_2$ or low-k material in the recess on the nitride spacers; and forming the replacement metal gate electrode in the recess. Aspects also include removing a portion of the nitride spacers prior to forming the replacement metal gate in the recess. Aspects include forming the metal nitride from titanium nitride, and forming the nitride spacers from silicon nitride.

Another aspect of the present disclosure includes a device including a replacement metal gate structure over a substrate, the replacement metal gate structure including a metal gate, a layer of $SiO_2$ or low-k material on side surfaces of the replacement metal gate, and a nitride spacer on the layer of $SiO_2$ or low-k material; and optionally a trench silicide layer spaced apart from the replacement metal gate.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompa- FIG. 1 schematically illustrates a device in accordance with an embodiment of the present disclosure.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves, inter alia, the parasitic capacitance problem which constitutes a major impediment to the performance of scaled MOSFETs, particularly in devices with replacement metal gates. Such devices typically comprise a trench silicide between replacement metal gate electrodes, though the trench silicide is optional. In some embodiments, the trench silicide layer may be formed on a raised source/drain region. The replacement metal gates typically have a high-k layer on side surfaces thereof, such as a high-k layer having a dielectric constant k of at least 15, and a silicon nitride spacer layer thereon, typically with a dielectric constant of about 7. It was found that a high parasitic capacitance is generated in such structures. In accordance with the embodiments of the present disclosure, this problem is addressed and solved by, inter alia, replacing the high-k layer with a $SiO_2$ or low-k layer in a manner easily integrated into current replacement metal gate process flows without complicating or decreasing manufacturing throughput. Suitable low-k materials for use in embodiments of the present disclosure include fluorine doped silicon oxide having a dielectric constant of 3.5, or carbon doped silicon oxide having a dielectric constant of 3.0.

Methodology in accordance with embodiments of the present disclosure include integrating formation of a $SiO_2$ or low-k dielectric spacer into a current replacement metal gate process flow. This may be implemented by removing the high-k layer and, optionally, a portion of the silicon nitride spacer, and then depositing a layer of $SiO_2$ or low-k material to form the $SiO_2$ or low-k spacer prior to forming the replacement metal gate electrode.

Figure 1:
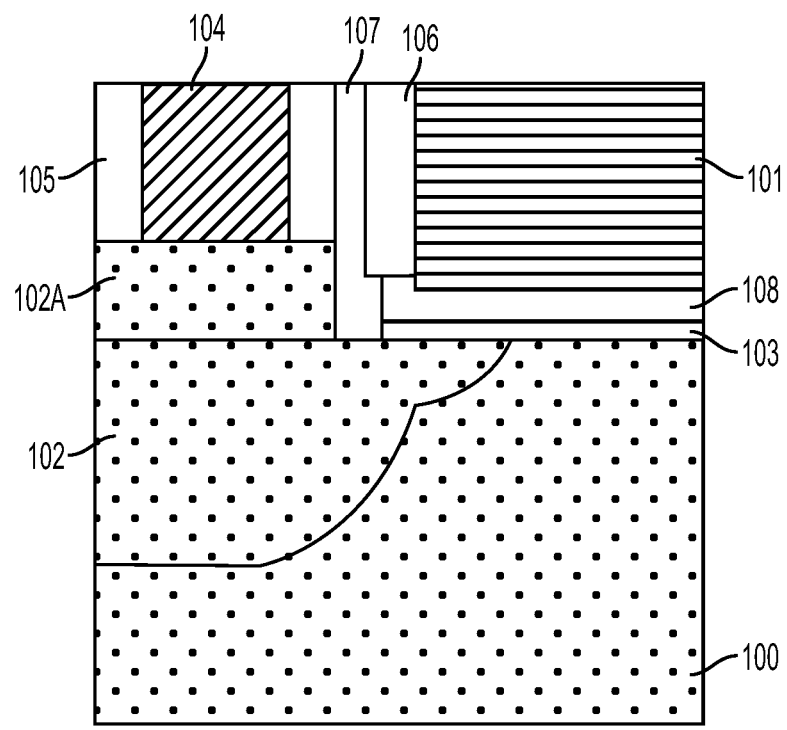

A device in accordance with an embodiment of the present disclosure is schematically illustrated in FIG. 1 and comprises substrate 100, source/drain region 102 with optional raised source/drain region 102A, gate electrode 101, interfacial layer 103, optional trench silicide layer 104, and interlayer dielectric 105. In accordance with embodiments of the present disclosure, a $SiO_2$ or low-k dielectric layer 106, such as doped silicon oxide having a dielectric constant of 3 to 3.5, is provided on the side surface of replacement metal gate electrode 101. Silicon nitride spacer 107, previously formed, remains and abuts the $SiO_2$ or low-k dielectric layer, with a layer of high-k material 108 underlying the replacement metal gate 101. It was found that the strategic replacement of a high-k layer with a $SiO_2$ or low-k layer reduces parasitic capacitance by improving overall performance of the device.

In accordance with an embodiment of the present disclosure, a trench silicide may be included which can comprise any of various metal silicides employed in the fabrication of semiconductor devices, such as nickel silicide, titanium silicide or cobalt silicide. In accordance with embodiments of the present disclosure, the placement of a $SiO_2$ or low-k layer ameliorates the negative impact on parasitic capacitance caused by the reduction in distance between the trench silicide 104 and metal gate 101. In accordance with embodiments of the present disclosure, the distance between the trench silicide 104 and replacement metal gate 101 can be reduced below 15 nm, such as below 8 nm, e.g., 4.8 nm, without adversely affecting parasitic capacitance. The $SiO_2$ or low-k layer 106 may have a thickness such as below 5 nm, e.g., 1.5 nm.

A method in accordance with an embodiment of the present disclosure is schematically illustrated in FIGS. 2A through 2I, wherein similar features are designated by like reference characters. Adverting to the intermediate structure schematically illustrated in FIG. 2A, the removable gate electrode has been removed resulting in the structure including substrate 200, interfacial layer 203, typically silicon oxide, interlayer dielectric 201, sidewall spacer 202, such as a silicon nitride, high-k layer 204, and metal nitride layer 205, such as titanium nitride. High-k layer 204 may comprise any of various high-k materials typically employed in the fabrication of semiconductor devices, including hafnium dioxide ($HfO_2$), having a dielectric constant of 25. Other suitable high-k materials may include aluminum oxide, zirconium oxide, lanthanum oxide, titanium oxide, tantalum oxide, tungsten oxide, serium oxide, yttrium oxide, zirconium silicate, hafnium silicate, hafnium aluminate, lanthanum aluminate, lead titanate, barium titanate, strontium titanate, and barium strontium titanate. High-k layer 204 can be formed at a thickness of 1.5 to 2 nm, while silicon nitride spacer 202 can be formed at a thickness of 4.8 to 15 nm.

Figure 2A:
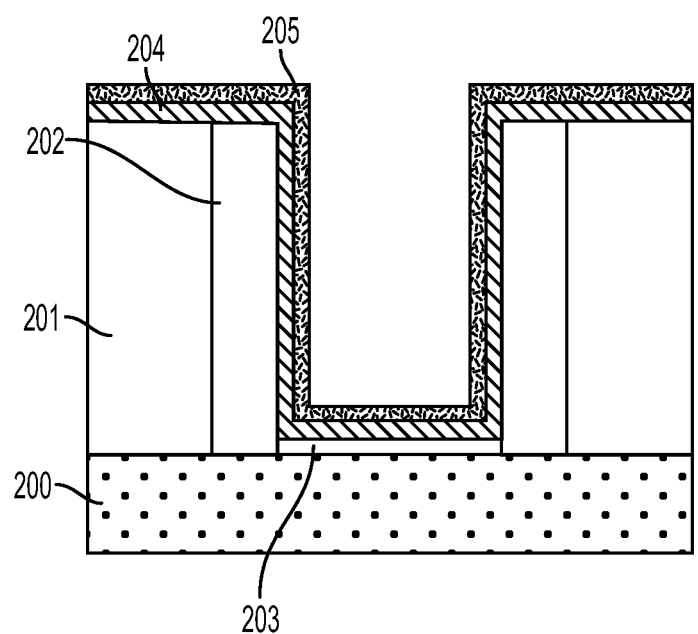
FIGS. 2A through 2I schematically illustrate sequential steps of a method in accordance with an embodiment of the present disclosure.
Figure 2B:
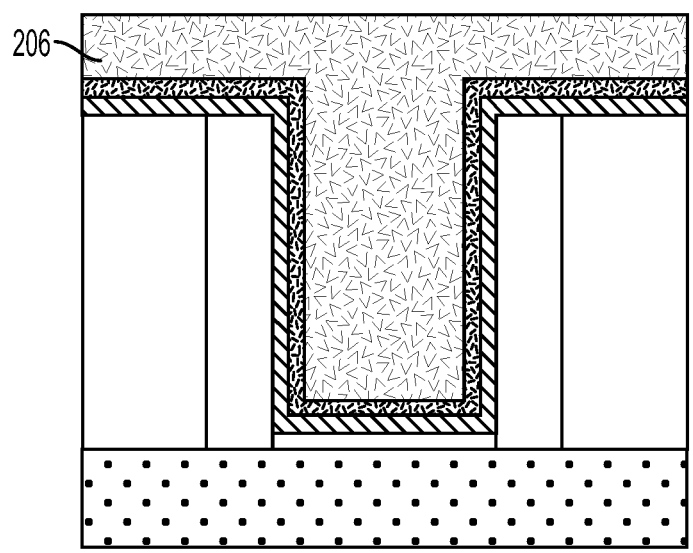
Figure 2C:
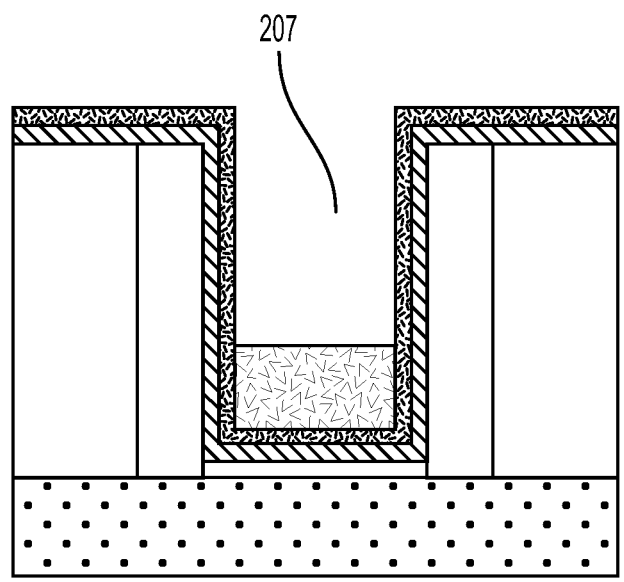
Figure 2D:
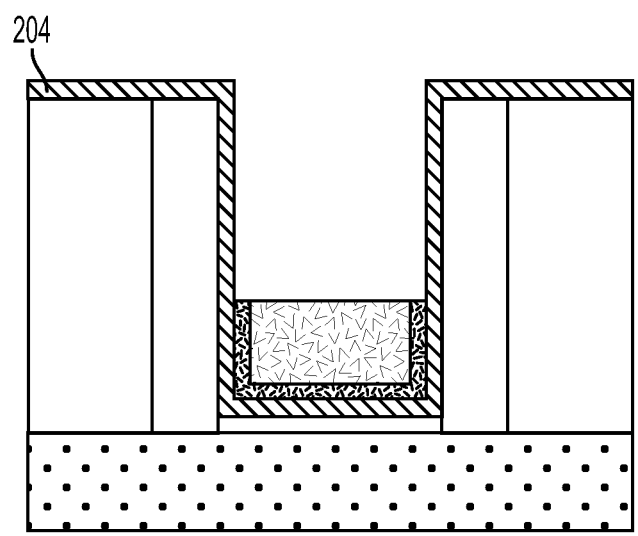

Adverting to FIG. 2B, a polymeric material 206 is deposited, such as an organic planarizing layer (OPL). Subsequently, as illustrated in FIG. 2C, a portion of OPL 206 is removed to form a recess 207 extending to a depth such as 15 to 25 nm. Etching is conducted to remove the exposed metal nitride layer 205, resulting in the structure schematically illustrated in FIG. 2D.

Figure 2E:
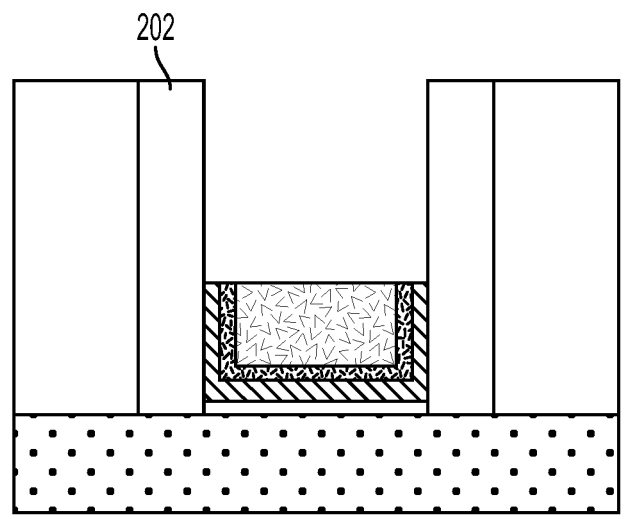
Figure 2F:
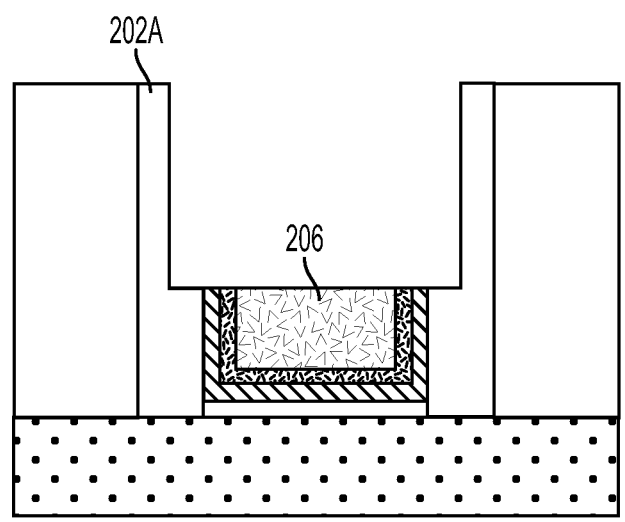

The exposed portion of high-k layer 204 is then removed, as by etching with a hydrogen fluoride solution, resulting in a structure illustrated in FIG. 2E. A portion of silicon nitride spacer 202 above remaining OPL 206 may then be removed, as by reducing the spacer width by e.g., 3 to 6 nm, thereby advantageously widening the opening and facilitating subsequent metal filling, as illustrated in FIG. 2F.

Figure 2G:
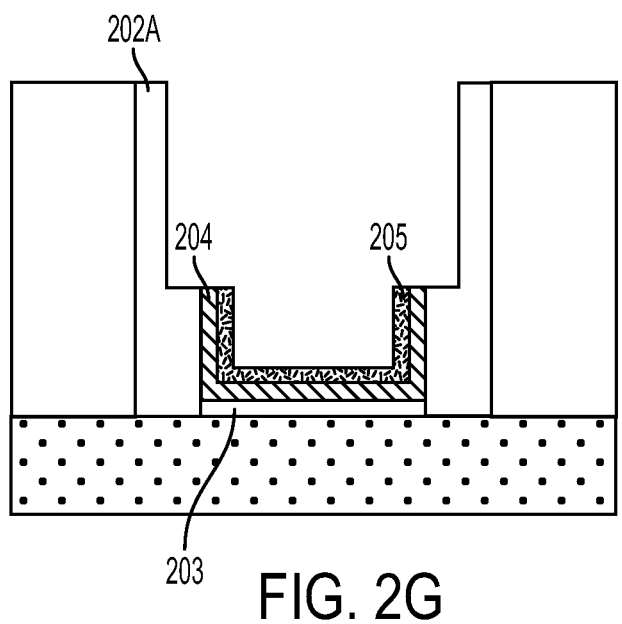
Figure 2H:
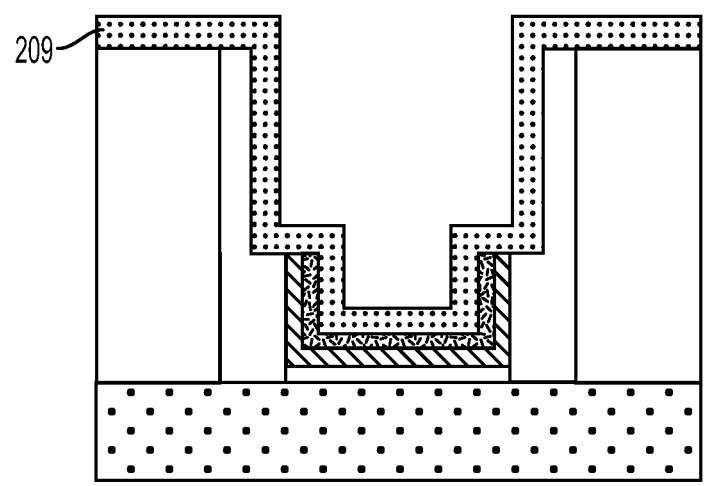
Figure 2I:
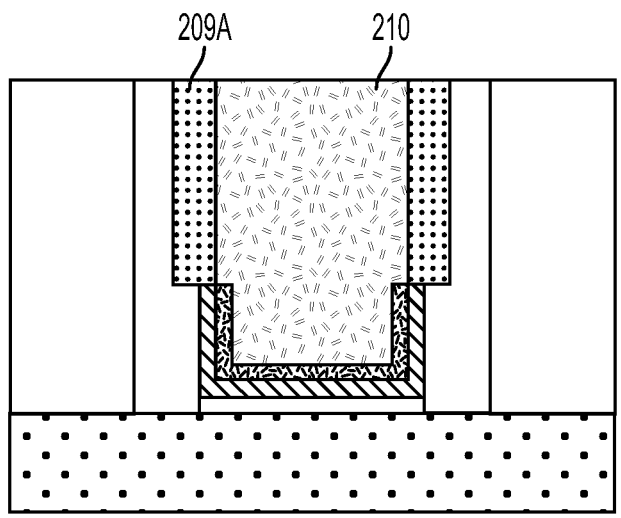

Subsequently, as illustrated in FIG. 2G, the remainder of the OPL layer 206 is removed from the bottom of the opening. In accordance with embodiments of the present disclosure, a $SiO_2$ or low-k dielectric layer 209 is then deposited. Low-k dielectric layer 209 may be a fluorine doped silicon dioxide with a dielectric constant of 3.5, a carbon doped silicon dioxide having a dielectric constant of 3.0, or another suitable low-k material. Anisotropic etching is then conducted, as by reactive ion etching with $CF_4$ to form the $SiO_2$ or low-k sidewall spacers 209A, as shown in FIG. 2I. Subsequent processing is conducted in accordance with current practices and involves forming replacement metal gate 210. For example, embodiments of the present disclosure include titanium aluminum/titanium/aluminum metal gates for an NFET and titanium nitride/titanium/aluminum metal gates for a PFET. Embodiments of the present disclosure include the use of any type of replacement metal gate structures typically employed in the fabrication of semiconductor devices.

The optional raised source/drain region and optional trench silicide may be formed before or after formation of the replacement metal gate and $SiO_2$ or low-k sidewall spacer, depending upon the process flow. By employing a low-k sidewall spacer, parasitic capacitance is significantly reduced thereby increasing the overall performance of scaled MOSFETs particularly when employing a replacement metal gate process flow.

The embodiments of the present disclosure achieve several technical effects, particularly in fabricating semiconductor devices with dimensions in the deep submicron range, such as exhibiting reduced parasitic capacitance, thereby enhancing reliability and performance, and enhancing productivity by improving metal filling. Embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   a substrate;
   a replacement metal gate electrode on the substrate;
   a layer of silicon dioxide ($SiO_2$) or low-k material on a side surface of the replacement metal gate electrode; and
   a trench silicide spaced apart from the replacement metal gate electrode at a distance of 4.8 nm to less than 15 nm without adversely affecting parasitic capacitance between the trench silicide and the replacement metal gate due to placement of the layer of $SiO_2$ or low-k material on the side surface of the replacement metal gate electrode wherein a top surface of the trech silicide is co-planar with a top surface of the replacement metal gate.

2. The device according to claim 1, comprising a layer of $SiO_2$ on the side surface of the replacement metal gate electrode.

3. The device according to claim 1, comprising a layer of low-k material on the side surface of the replacement metal gate electrode, wherein the layer of low-k material comprises a fluorine or carbon doped silicon oxide.

4. The device according to claim 1, wherein the replacement metal gate electrode comprises at least one of titanium aluminum, titanium, aluminum, and titanium nitride.

5. The device according to claim 1, further comprising a raised source/drain region on the substrate spaced from the replacement metal gate electrode.

6. The device according to claim 1, wherein the layer of $SiO_2$ or low-k material has a thickness of less than 8 nm.

7. The device according to claim 1, comprising a layer of high-k material underlying the replacement metal gate electrode, and an interfacial layer underlying the layer of high-k material, wherein the layer of high-k material has a dielectric constant k of at least 15, and wherein interfacial layer comprises silicon oxide.

8. The device according to claim 1, wherein the replacement metal gate electrode has a substantially uniform width.

9. The device according to claim 1, wherein the layer of $SiO_2$ or low-k material is has a substantially uniform width.

10. A method comprising:
    forming a replacement metal gate structure over a substrate, the replacement metal gate structure comprising a replacement metal gate;
    forming a first spacer layer on side surfaces of the replacement metal gate and a second spacer on the first spacer layer, wherein the first spacer layer and second spacer have different dielectric constants; and
    forming a trench silicide layer spaced apart from the replacement metal gate at a distance of 4.8 nm to less than 15 nm without adversely affecting parasitic capacitance between the trench silicide layer and the replacement metal gate wherein a top surface of the trench silicide is co-planar with a top surface of the replacement metal gate.

11. The method according to claim 10 comprising forming the first spacer layer of a low-k material having a dielectric constant no greater than 3.9 or silicon dioxide ($SiO_2$) and the second spacer of a nitride.

12. The method according to claim 10, comprising:
    forming an intermediate gate structure in an insulating layer, the intermediate gate structure comprising a removable gate having the second spacer on side surfaces thereof;
    removing the removable gate leaving an opening having a width defined by the second spacers;
    forming a layer of high-k material on the second spacers lining the opening;
    forming a layer of metal nitride on the layer of high-k material;
    filling the opening with an insulating material;
    removing a portion of the insulating material from the opening leaving a recess having a width defined by the metal nitride layer;
    removing the metal nitride layer from the recess, leaving the recess with a width defined by the layer of high-k material;
    removing the layer of high-k material from the recess, leaving the recess with a width defined by the second spacers;
    forming the first spacer layer in the recess on the second spacers; and
    forming the replacement metal gate in the recess.

13. The method according to claim 12, comprising:
    removing a portion of each second spacer to reduce its thickness prior to forming the first spacer layer; and
    forming the layer of high-k material from a material having a dielectric constant k of at least 15,
    wherein the metal nitride comprises titanium nitride, and
    wherein the second spacers comprise a silicon nitride.

14. A device comprising:
    a replacement metal gate structure over a substrate, the replacement metal gate structure comprising a replacement metal gate;
    a layer of $SiO_2$ or low-k material on side surfaces of the replacement metal gate;
    a nitride spacer on the layer of $SiO_2$ or low-k material; and
    a trench silicide spaced apart from the replacement metal gate electrode at a distance of 4.8 nm to less than 15 nm without adversely affecting parasitic capacitance between the trench silicide and the replacement metal gate wherein a top surface of the trench silicide is coplanar with a top surface of the replacement metal gate.

15. The device according to claim 14, comprising a layer of carbon or fluorine doped silicon oxide on the replacement metal gate.

16. The device according to claim 14, wherein the layer of $SiO_2$ or low-k material has a thickness of less than 8 nm.

17. The device according to claim 14, wherein the trench silicide layer is formed on a raised source/drain region spaced apart from the replacement metal gate at a distance greater than the trench silicide layer.

18. The device according to claim 14, comprising a layer of high-k material underlying the replacement metal gate, and an interfacial layer underlying the layer of high-k material, wherein the layer of high-k material has a dielectric constant k of at least 15, and wherein interfacial layer comprises silicon oxide.

19. The device according to claim 14, wherein the replacement metal gate has a substantially uniform width.

20. The device according to claim 14, wherein the layer of $SiO_2$ or low-k material is has a substantially uniform width.

* * * * *